United States Patent
Lepercq et al.

(10) Patent No.: US 10,467,368 B2
(45) Date of Patent: Nov. 5, 2019

(54) PEAK WIRELENGTH AWARE COMPILER FOR FPGA AND FPGA-BASED EMULATION

(71) Applicant: Synopsys, Inc., Mountain View, CA (US)

(72) Inventors: Etienne Lepercq, Shrewsbury, MA (US); Jiahua Zhu, West Boylston, MA (US); Jiong Cao, Shanghai (CN); Marc-Andre Daigneault, Marlborough, MA (US)

(73) Assignee: Synopsys, Inc., Mountain View, CA (US)

( * ) Notice: Subject to any disclaimer, the term of this patent is extended or adjusted under 35 U.S.C. 154(b) by 66 days.

(21) Appl. No.: 15/806,932

(22) Filed: Nov. 8, 2017

(65) Prior Publication Data

US 2018/0150582 A1   May 31, 2018

Related U.S. Application Data

(60) Provisional application No. 62/428,373, filed on Nov. 30, 2016.

(51) Int. Cl.
   *G06F 17/50*   (2006.01)

(52) U.S. Cl.
   CPC ...... *G06F 17/5054* (2013.01); *G06F 17/5027* (2013.01); *G06F 17/5072* (2013.01)

(58) Field of Classification Search
   USPC ........................................................ 716/121
   See application file for complete search history.

(56) References Cited

U.S. PATENT DOCUMENTS

| 2006/0190237 A1* | 8/2006 | Beausoleil | G06F 17/5022 703/23 |
| 2015/0227670 A1* | 8/2015 | Gordon | G06F 17/5081 716/52 |
| 2018/0150582 A1* | 5/2018 | Lepercq | G06F 17/5027 |

OTHER PUBLICATIONS

Jindal, T. et al., "Detecting Tangled Logic Structures in VLSI Netlists," DAC'10, Jun. 13-18, 2010, pp. 603-608.

* cited by examiner

*Primary Examiner* — Mohammed Alam
(74) *Attorney, Agent, or Firm* — Fenwick & West LLP

(57) ABSTRACT

A computer-implemented method generates a plurality of clusters based on components included in a design under test (DUT); classifies a subset of clusters of the plurality of clusters as tangled clusters; modifies at least two tangled clusters of the subset of clusters based on overlap between the at least two tangled clusters; determines, for each tangled cluster in the subset of clusters, a gate count based on the interconnectivity of the tangled cluster; and partitions the DUT among a plurality of field-programmable gate arrays (FPGAs) based on the gate count determined for each tangled cluster from the subset of clusters.

22 Claims, 12 Drawing Sheets

PEAK WIRELENGTH AWARE COMPILER FOR FPGA AND FPGA-BASED EMULATION

CROSS REFERENCE TO RELATED APPLICATION

This application claims the benefit of U.S. Provisional Application No. 62/428,373, entitled "Peak Wirelength Aware Compiler for FPGA and FPGA-Based Emulation," filed Nov. 30, 2016, which is incorporated by reference herein in its entirety.

FIELD

The present disclosure relates generally to computer aided testing of a circuit design, and more specifically to improved compilation of a circuit design for emulation of the design.

BACKGROUND

Integrated circuit (IC) designers commonly describe their designs in hardware description language (HDL) such as Verilog, VHDL, SystemC, and the like. In IC design, hardware emulation may refer to the process of replicating behavior of one or more pieces of hardware such as a circuit design, hereinafter also referred to as a design under test (DUT), with another piece of hardware, such as a special-purpose emulation system. An emulation model is usually generated in accordance with an HDL source code representing the design under test. The emulation model is compiled into a format used to program the emulation system that may include one or more field programmable gate array (FPGA). Thereby, the DUT is mapped by the compiler into the FPGA(s) of the emulation system. Running the emulation system as programmed with the emulation model enables debugging and functional verification of the DUT. Overall progress of the emulation is usually controlled by a master clock signal generated on the emulator hardware, which enables the emulation model to run on the emulation hardware at much higher speed than when simulating the DUT entirely in software.

Conventional methods to correct for FPGA compiler failures in an FPGA-based emulation system may be resource intensive and failures may take weeks or months to correct. Additionally, changes to the original circuit design or a change in setup (for example, changes in debug parameters) may cause instability in the FPGA compilation due to the presence of tangled logic (defined below). Thus, there is the need for a fully automated solution to detect tangled logic and to take advantage of the partitioning of the detected tangled logic to ensure success of and reduce resource allocation during the FPGA compilation.

BRIEF SUMMARY

Embodiments of a method are disclosed to detect areas of a circuit design that may generate a high wire demand once mapped onto an FPGA. The wire demand is transformed to a gate-count equivalent. This may inflate the area of the congested areas by several factors and the overall design size by a few percent. A partitioning algorithm then operates on the weighted (inflated) design. As a consequence, the partitioning algorithm may generate lower true filling rates for FPGAs where the highly-congested logic is mapped, while minimally or not affecting other FPGAs. This may relieve routing pressure on the FPGA compiler, allowing FPGAs that include highly-congested logic to compile and/or to compile faster.

By grouping the gates by detected clusters, the partitioning algorithm may spread the detected clusters across multiple available physical FPGAs, thus preventing multiple clusters from being mapped onto the same FPGA. This partitioning method may enhance a conventional algorithm by modelling each cluster as a resource inside each FPGA and setting an overflow threshold.

Tangled logic detection is used to influence component placement inside each FPGA. Each component (e.g., lookup table, register, etc.) within a tangled cluster receives a large weighting factor to prevent the FPGA compiler from packing them densely. This white spacing technique may reduce routing congestion. By taking advantage of a strong correlation between tangled logic and routing congestion, FPGA compilation may be performed faster and more robustly.

The disclosed methods may also provide an increase in the overall capacity of an FPGA-based emulation system. Default filling-rates without tangled logic detection are tuned to make most FPGAs compile easily, with typically a few (with the undetected tangled logic) taking longer—or sometimes failing. However, higher filling-rates may be achieved in most FPGAs as the circuit logic mapped onto the FPGAs for emulation does not indicate routing congestion. By making the partitioning algorithm aware of wire demand, the average filling rate may be increased for lookup tables (LUTs) and registers—typically by 10-15%. This increase in capacity may have a positive impact on the runtime performance of FPGA-based emulation systems.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
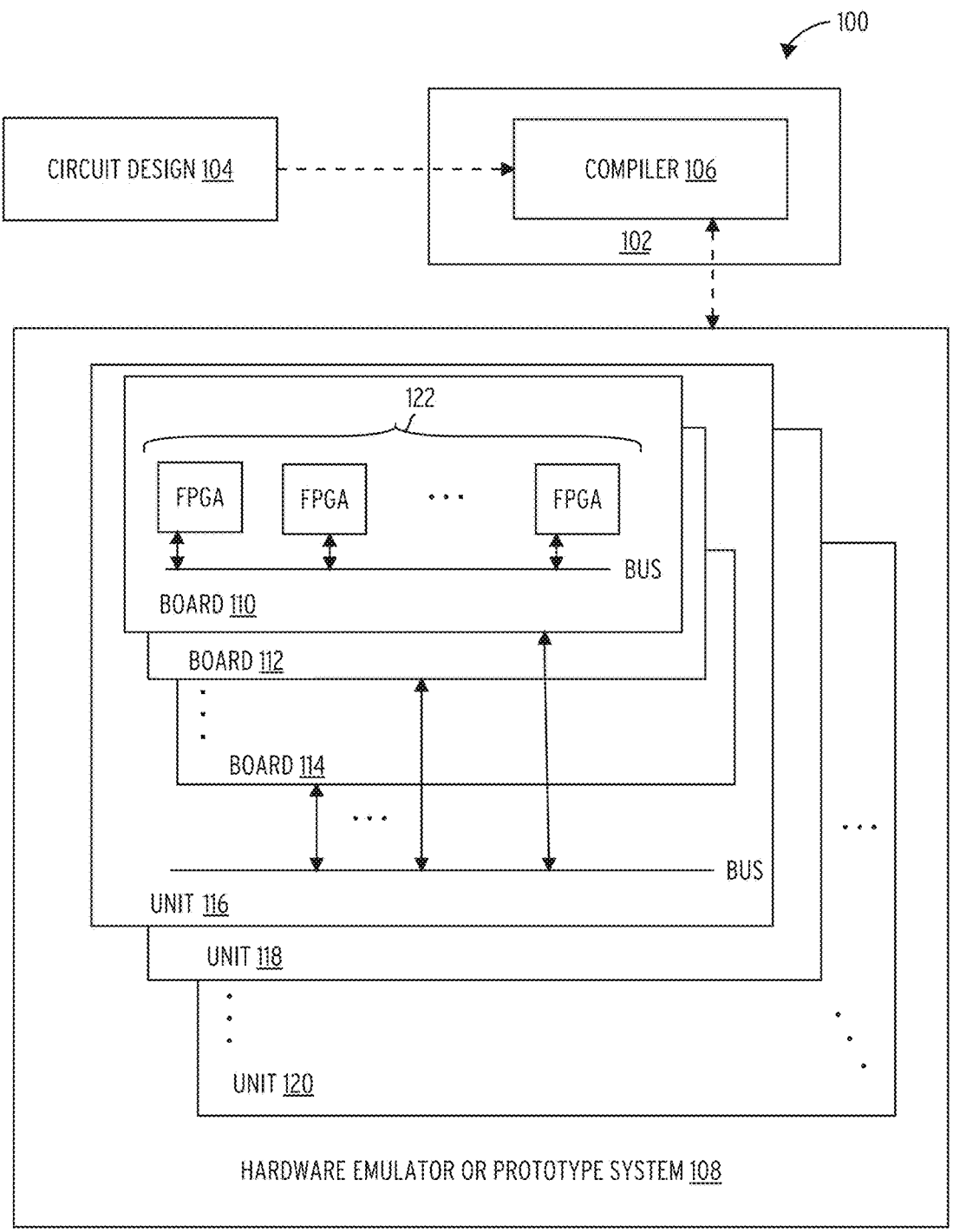
FIG. 1 is an exemplary high-level block diagram of a hardware verification system 100, in accordance with one example embodiment.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

"FPGA compiler" in this context refers to a process that takes a netlist as input and generates a configuration bit stream that is used to program an FPGA to emulate components of the netlist. If FPGA compilation fails, it indicates that the circuit design cannot be emulated by the emulator.

"Global FPGA resource" in this context refers to an FPGA resource that is available to the FPGA compiler to emulate any partition of the circuit. Examples are FPGA registers, lookup tables (LUT), block random-access memory (BRAM), digital signal processor (DSP), and any other basic resource the FPGA provides, as commonly understood in the art.

"Tangled logic" in this context refers to a highly-connected group of gates that unless specially managed, may create local congestion within an FPGA. Tangled logic is not considered herein as belonging to the global FPGA resource pool. Tangled logic may cause failures during the FPGA compilation or may utilize additional resources to successfully complete the FPGA compilation. Typically only 1% to 10% of a circuit to emulate involves tangled logic, but managing these small portions may account for a disproportionate consumption of resources by the FPGA compiler.

"Circuitry" in this context refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

"Computer model" in this context refers to the logic (e.g., algorithms and equations) that represents the behavior of the system being modeled. Computer simulation is the actual execution of logic comprising these equations or algorithms. Simulation, therefore, is the process of executing a model.

"Firmware" in this context refers to software logic embodied as processor-executable instructions stored in read-only memories or media.

"Hardware" in this context refers to logic embodied as analog or digital circuitry.

"Logic" in this context refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Programmable device" in this context refers to an integrated circuit designed to be configured and/or reconfigured after manufacturing. The term "programmable processor" is another name for a programmable device herein. Programmable devices may include programmable processors, such as field programmable gate arrays (FPGAs), configurable hardware logic (CHL), and/or any other type programmable devices. Configuration of the programmable device is generally specified using a computer code or data such as a hardware description language (HDL), such as for example Verilog, VHDL, or the like. A programmable device may include an array of programmable logic blocks and a hierarchy of reconfigurable interconnects that allow the programmable logic blocks to be coupled to each other according to the descriptions in the HDL code. Each of the programmable logic blocks may be configured to perform complex combinational functions, or merely simple logic gates, such as AND, and XOR logic blocks. In most FPGAs, logic blocks also include memory elements, which may be simple latches, flip-flops, hereinafter also referred to as "flops," or more complex blocks of memory. Depending on the length of the interconnections between different logic blocks, signals may arrive at input terminals of the logic blocks at different times.

"Software" in this context refers to logic implemented as processor-executable instructions in a machine memory (e.g. read/write volatile or nonvolatile memory or media).

FIG. 1 is an exemplary high-level block diagram of a hardware verification system 100, in accordance with one embodiment of the present invention. The hardware verification system 100 may be used to verify, test or debug a circuit design 104. The hardware verification system 100 may include a hardware emulator or prototype system 108 and a computer system 102 that is described in reference to FIG. 12. As depicted in FIG. 1, the hardware emulator or prototype system 108 may be coupled to the computer system 200, which may include a compiler 106 module that may receive a hardware description language representation of the circuit design 104.

The compiler 106 may include a multitude of various software modules that may or may not include a dedicated compiler module. The compiler 106 may transform, change, reconfigure, add new functions to, and/or control the timing of the circuit design 104 to facilitate verification, emulation, or prototyping of the circuit design 104. Further, the compiler 106 may compile the circuit design 104 and any associated changes into a binary image used to program the hardware emulator or prototype system 108.

In some embodiments, the computer system 102 includes two compilers 106: a emulation compiler and an FPGA compiler. The emulation compiler partitions the circuit design 104 into multiple partitions, each one mapping to an FPGA in the hardware emulator or prototype system 108. The FPGA compiler performs placement and routing for each partition mapping to a different FPGA. In some embodiments, the FPGA compiler and the emulation compiler may be on different computer systems 102. In some embodiments, the compiler 106 includes an emulation compiler, and the FPGA compiler is integrated into the hardware emulator or prototype system 108. The FPGA compiler may be provided by a FPGA vendor, and the emulation compiler may be part of an emulation tool.

The logical functions and timing of the circuit design 104 that may ultimately be implemented by hardware in an integrated circuit chip may instead be first implemented in the hardware emulator or prototype system 108. Among other advantages, verification of the circuit design 104 in hardware may be accomplished at much higher speed than by software verification alone.

The hardware emulator or prototype system 108 may include a multitude of emulator units (e.g., unit 116, unit 118, unit 120) each comprising one or more circuit boards (e.g., board 110, board 112, board 114). Each board may comprise one or more programmable processors 122, such a Field Programmable Gate Arrays (FPGAs), and other blocks (not shown), such as memories, input/output devices, other processors, and the like. The hardware emulator or prototype system 108 receives a compiled circuit design from the compiler 106, and programs the programmable processors 122 to verify behavior of the circuit design 104. The hardware emulator or prototype system 108 may include a primary or master system clock from which a number of other clock signals may be generated.

Figure 2:
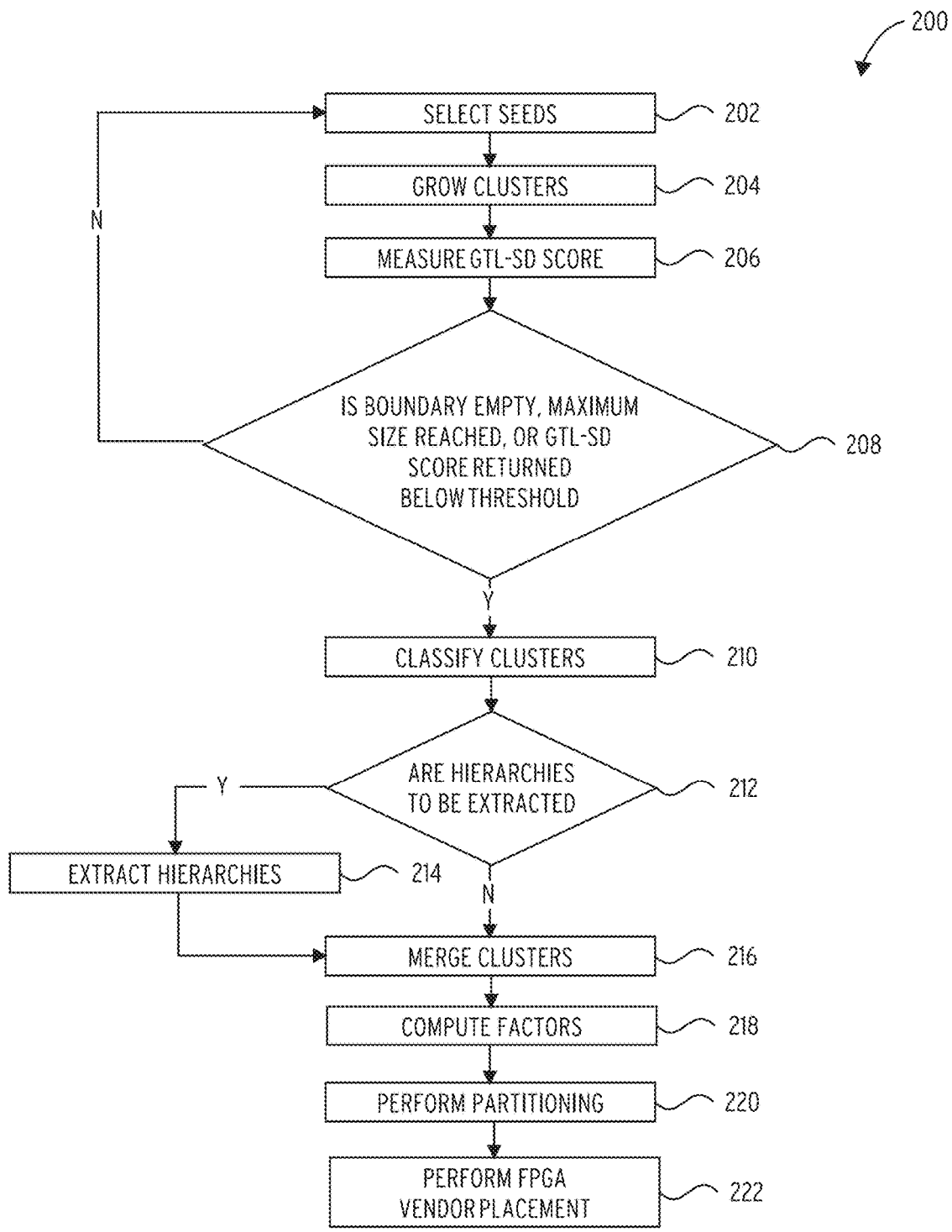
FIG. 2 illustrates an embodiment of a compilation process 200.

FIG. 2 shows a compilation process 200 which is performed by the compiler 106. An emulation compiler may perform a portion of the process 200, and an FPGA compiler may perform another portion of the process 200. For example, an emulation compile may perform steps 202-220, resulting in a partitioned DUT, while an FPGA compiler may perform step 222.

The compiler 106 selects seeds (block 202). The compiler 106 may select a number (S) of seeds, which are starting points of clusters. The selection may be a uniform distribution of S seeds among all leafs in a netlist, with no specific ordering. Such an approach may provide a good average distance between any two seeds. In some embodiments, a more complex algorithm, such as a random walk, may be utilized to select the seeds.

The compiler 106 processes N clusters in parallel to decrease the compile time. Each compilation thread may be provided with a list of Ns, seeds to process, where Ns, is a subset of S and the union of all Ns, is equal to S. The seeds within each list of seeds may be processed sequentially.

After selecting seeds, the compiler 106 grows clusters (block 204). A cluster is a list of leafs (i.e., circuit elements) that comprise a subset of the original netlist. Each processing thread may create a cluster from the originally assigned seeds. Each cluster may be grown by ranking all leafs directly connected to the cluster (or, originally, by ranking the seeds). The ranked leafs are not part of the cluster but form the boundary of the cluster.

The rank of individual leafs at the cluster boundary may be determined by computing the ratio of the connectivity of the leaf to the cluster, and the individual leaf s connectivity to leafs outside of the cluster. The higher the ratio, the higher the rank of the leaf. Once leafs at the boundary are ranked, the highest ranked leaf is added to the cluster. The list of leafs in the boundary is updated, and the process is repeated by ranking the leafs in the updated boundary.

The compiler measures, for each cluster, a group of tangled logic density-aware score ("GTL-SD score") (block 206). The process of growing a cluster as well as an algorithm for computing the GTL-SD score for a cluster are described in detail in "Detecting Tangled Logic Structures in VLSI Netlists" by Tanuj Jindal, Charles J. Alpert, Jiang Hu, Zhuo Li, GiJoon Nam, Charles B. Winn, in DAC 2010, which is incorporated herein by reference. The score of the cluster (the GTL-SD score) is maintained throughout cluster construction. This score may be utilized to compare the internal connectivity of the cluster as estimated by the average pin-per-gate against the expected connectivity as described by Rent's rule.

The GTL-SD maximum value (peak) is stored for use during cluster classification. The growth of a cluster ends when the boundary is empty or the maximum size of the cluster is reached. The maximum size value for a cluster may be set as a hard limit. The growth of the cluster may also end once the GTL-SD score reverts to a lower threshold (i.e., "stop threshold").

The compiler 106 determines whether the boundary is empty, whether the maximum size has been reached, and/or whether the GTL-SD score has dropped below a threshold (decision block 208). If the condition or conditions being used for decision 208 are not met, the compiler 106 returns the compilation process 200 to block 202.

If, for a given cluster, one of the conditions is met in the decision block 208, the compiler 106 classifies the cluster (block 210). Block 210 is performed for each cluster for which a condition is met. The compiler 106 may classifier a cluster as tangled (i.e., highly connected) and provide its parameters to the partitioning algorithm and/or a FPGA-vendor placing algorithm. The compiler 106 may identify the tangled clusters in a netlist. The list of grown clusters is then processed to determine if each grown cluster is tangled. A cluster may be classified as tangled when its peak GTL-SD score is above a determined threshold. This threshold may be determined based on blocks that may cause complications during FPGA compilation. Applying the threshold may reduce the number of non-tangled clusters reported as tangled.

Figure 3:
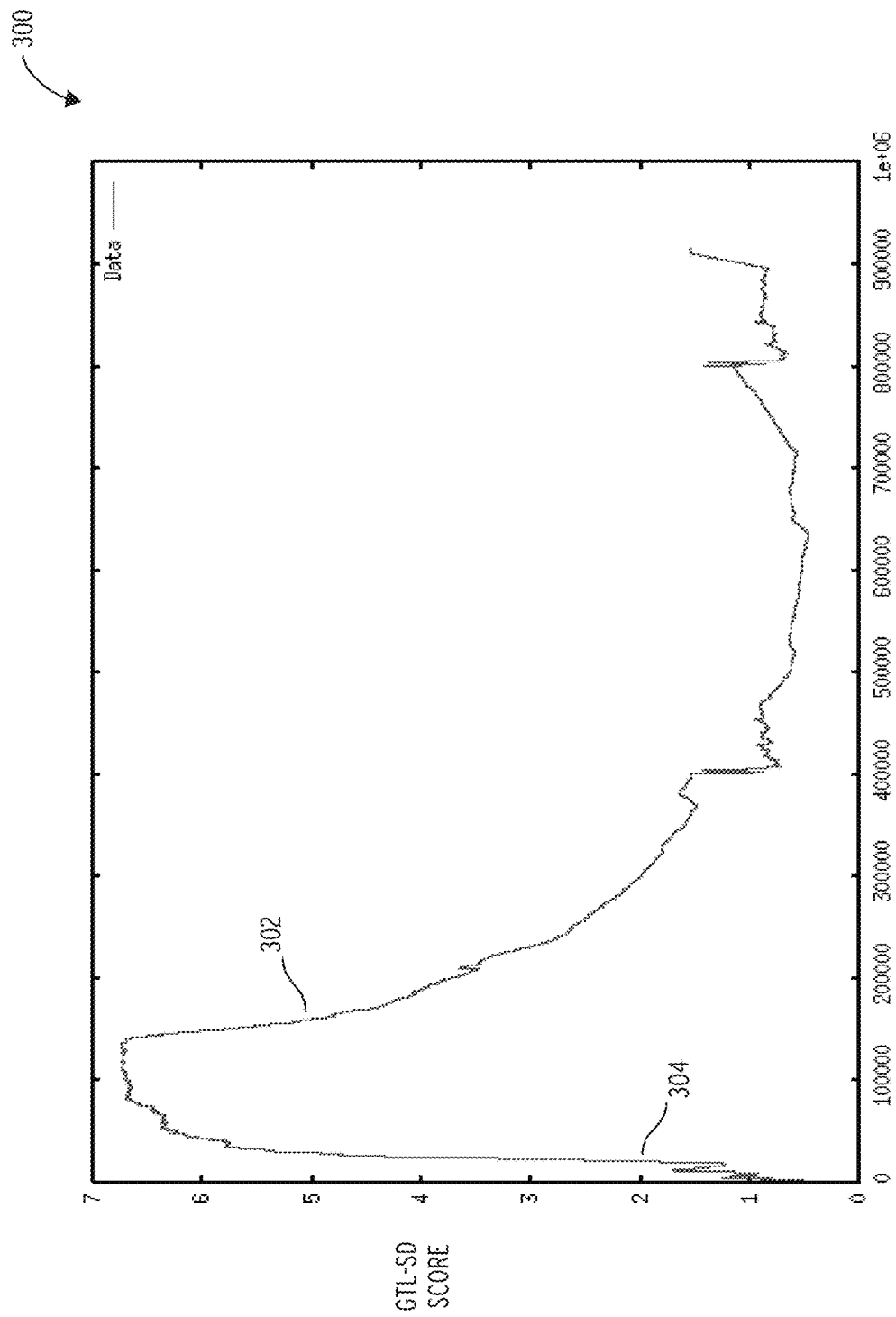
FIG. 3 illustrates an embodiment of a GTL-SD curve of a tangled cluster 300.

The tangled clusters may be further processed by discarding leafs that were inserted prior to reaching the area of interest, and for which GTL-SD score is lower than a threshold, which may be determined empirically. FIG. 3 depicts an exemplary GTL-SD curve and key areas of interest. FIG. 3 is discussed in further detail below.

The GTL-SD curve may be post-processed to more accurately determine the end of the cluster. Because of the noise on the curve and differences in cluster sizes (e.g., ranging from a few hundreds of gates to several hundreds of thousands of gates), determining the cutoff point while growing the cluster may be difficult. The GTL-SD curve, as well as the cut curve of the cluster over time, may be utilized to determine the region of interest. The maximum difference between peak and the GTL-SD score after the peak is computed, as well as the lower-than-normal cut of the cluster, are aspects of the curve that may be utilized for this purpose. When the cut of the cluster is low compared to the expected Rent exponent (e.g., the average Rent exponent of the netlist), the cluster is well contained and may be utilized as an initial block selection in partitioning, allowing the partitioning to find a solution with better cuts.

The compiler 106 determines if cluster hierarchies are to be extracted (decision block 212). In some embodiments, the compiler 106 is not configured to extract hierarchies, and the process 200 proceeds directly from block 210 to block 216. In other embodiments, the compiler 106 is configured to always extract hierarchies, so the process 200 proceeds directly from block 210 to block 214. In other embodiments, hierarchy extraction is optional; for example, decision 212 may be set by a user. If hierarchies are to be extracted, the hierarchies are extracted (block 214). Extraction of the cluster hierarchies may reduce the amount of data provided to partitioning and may be utilized by some partitioning heuristics. Each tangled cluster may be processed to extract hierarchical information. From a leaf in the tangled cluster, its parent may be retrieved. The total number of leafs under this parent may be compared with total number of tangled leafs of that cluster. If the total number of tangled leafs of the cluster constitutes a high proportion of the total number of leafs under that parent, then the parent is reported, instead of all the leafs under the parent.

A threshold for the proportion of leafs under the parent may be utilized (e.g., 80%). The process may be recursive and may report the highest hierarchy. If the threshold is not reached, the hierarchy is dropped. This extraction may be compatible with the analysis reporting the list of leafs to partitioning, but each provides a different level of information. Hierarchy information may be utilized for seeding block selection during partitioning, helping to reduce cuts and improving emulation performance.

After extracting hierarchies, or if hierarchy extraction is not performed, the clusters are merged (block 216). Each cluster may be grown independently to utilize the multi-core architecture of modern CPUs (e.g., clusters are grown using multiple threads). As a result, some pairs or sets of clusters may overlap by a large proportion, while other pairs or sets of clusters overlap by small proportion. The cluster merge operation generates a list of disjoint groups of tangled clusters. Groups of tangled clusters are generated based on the ratio of the overlapping of the tangled clusters.

For example, if two tangled clusters overlap by more than a threshold (e.g., 80%), then the compiler 106 may merge those clusters into the same group, as one cluster. If two tangled clusters are overlapping by less than the threshold, the compiler 106 may assign the overlapping leafs between the two clusters to the larger cluster, and remove the overlapping leafs from the smaller cluster. At the end of the merging process 216, remaining tangled clusters that are small (e.g., smaller than a fixed threshold, or smaller relative to other remaining tangled clusters) may be deleted from the set of tangled clusters, as these groups may not significantly impact FPGA compilation.

The compiler 106 then computes factors, such as weight and gate-count equivalent, for each tangled cluster (block 218). Each cluster may be weighted by its complexity, which is estimated from key features such as size and interconnectivity. Once mapped onto an FPGA, any tangled logic may utilize many wires to accommodate for the high connectivity. If the FPGA has a high filling rate of gates, the FPGA-vendor router may have difficulty finding a routing solution connecting all gates according to the netlist within applicable timing constraints, as there may be lack of available routing resources in some locations.

The factor computation 218 may involve estimating the gate-count equivalent of the wire demand for each tangled cluster. A high connectivity is translated into virtual gates to accommodate for the actual resources available inside an FPGA. The factor may be computed based on individual characteristics of a cluster, such as peak GTL-SD score, size of cluster, shape of GTL-SD score curve (e.g., area under the curve), cut, number of clocks, etc. Those parameters are factored into a cost function, which may be built from empirical data, or utilizing machine learning to determine the best mapping based on available data. The final factor is then computed with weighted average of each cluster that belongs to the group.

Next, the compiler 106 performs partitioning of the DUT (block 220). The partitioning may account for the size of logic by using the factors computed at block 218. This may inflate some key areas, which mechanically reduces filling-rates of the FPGAs where the logic in those key areas are mapped.

Block selection performed by partitioning may be seeded by the reported clusters. The characteristics of each cluster that make it suitable for use as a block include an internal high-connectivity, a low external cut, and generally a size 4-10 times smaller than an FPGA. Each cluster (or group of clusters) may be moved based on having a low cut, while splitting the cluster or group of clusters may result in a high cut, which may decrease emulation performance.

To account for the areas of high wire demand, tangled clusters may be constrained onto different FPGAs by utilizing a cost function that may make moving two (or more) clusters onto the same FPGAs costly. Such a method reduces the number of clusters on the same FPGA, which may increase performance.

Finally, the compiler 106 (e.g., an FPGA compiler) performs FPGA vendor placement (block 222). During placement, spacing for wire demand and separation of different tangled clusters spatially may be accounted for, as the FPGA router may detour and apply routing resources outside the tangled cluster area.

One or more additional sub-processes may be utilized during the compilation process 200. In particular, these sub-processes may be performed by a FPGA compiler, after factors have been computed at 216. A first sub-process that may be added to process 200 involves expanding the area of each leaf marked as tangled by a factor. The placement at the FPGA level may ensure highly connected logic is placed to reduce the local number of LUTs and registers, thus saving wires for detours. This strategy may ensure tangled leafs are not placed too close together. The factor may be a scaled down version of the one used by the emulation compiler, and it may be in the range of 10% to 20%. The scaling factor may be determined by utilizing empirical data and the key characteristics of the tangled cluster, described above.

A second sub-process that may be included in process 200 involves utilizing each cluster as initial seeding for partitioning into dies. This use of clusters as initial seedings may reduce demand for physical connections between two dies, as each cluster may fit into the same die. In case a cluster is larger than a die, the partitioning algorithm may utilize fewer resources while determining a valid solution.

A third sub-process that may be included in process 200 involves mapping the largest clusters on different dies if several clusters are located in same FPGA. The mapping process may start with the center clusters, which have more connections and, thus, multiple neighbors. This mapping process may reduce local congestion, as two tangled clusters may compete for the same resources if placed into the same die. In some embodiments, the dies are super logic regions (SLRs).

Referring to FIG. 3, the GTL-SD curve of a tangled cluster 300 illustrates a tangled cluster threshold 302 and a discarded region threshold 304.

The tangled cluster threshold 302 may be utilized by the compiler 106 in the decision block 208, described above, to determine the completion of the growth of a cluster. Here, the threshold score is 5.0. The discarded region threshold 304 may be utilized by the compiler 106 in the block 210, described above, to discard leafs that were inserted prior to the cluster reaching its peak GTL-SD score and before the GTL-SD score reached a lower bound, e.g., 2.0. The area between the tangled cluster threshold 302 and the discarded region threshold 304 may define or be included in the tangled cluster.

In the exemplary embodiment of FIG. 3, growth was not stopped when the tangled cluster threshold 302 was reached the second time to show the behavior of GTL-SD score outside the tangled area.

Figure 4:
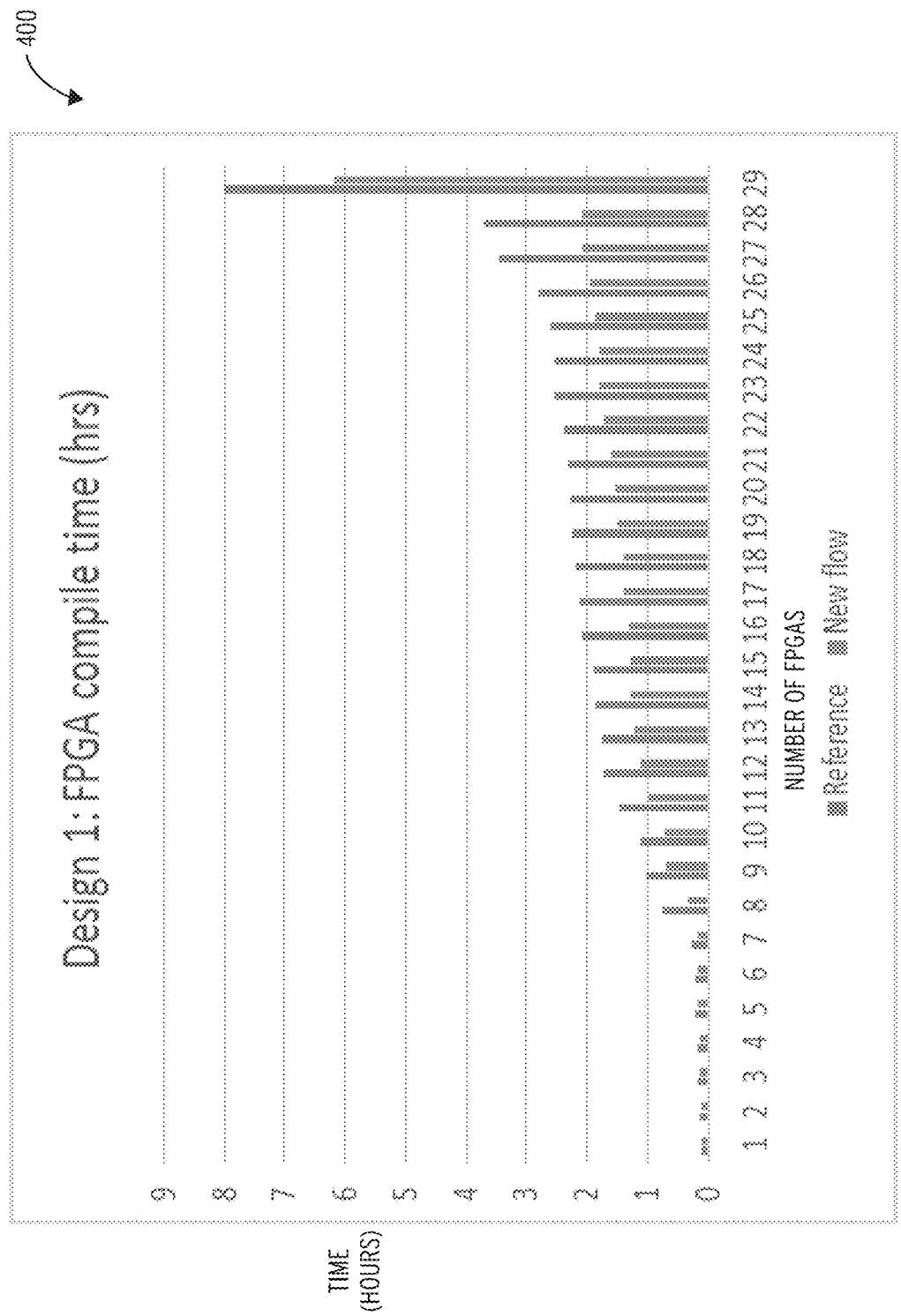
FIG. 4 illustrates exemplary design results 400.

Referring to FIG. 4, exemplary design results 400 are illustrated for FPGA-vendor support on a 30-FPGA design. FPGA-vendor support includes the three additional sub-processes performed on a vendor compiler. The design results 400 show compile time for a number of FPGAs using a conventional, reference method for FPGA compilation (blue), and for a method utilizing the disclosed new processes, including FPGA-vendor support (red). The design results 400 show a reduction of longest compilation by approximately two hours (i.e., six hours vs eight hours). Both of the design results 400 were obtained using the process 200 described above for partitioning the DUT into FPGAs; thus, the benefit shown in the new flow results is cumulative to performance benefits provided by the process 200 described above.

Figure 5:
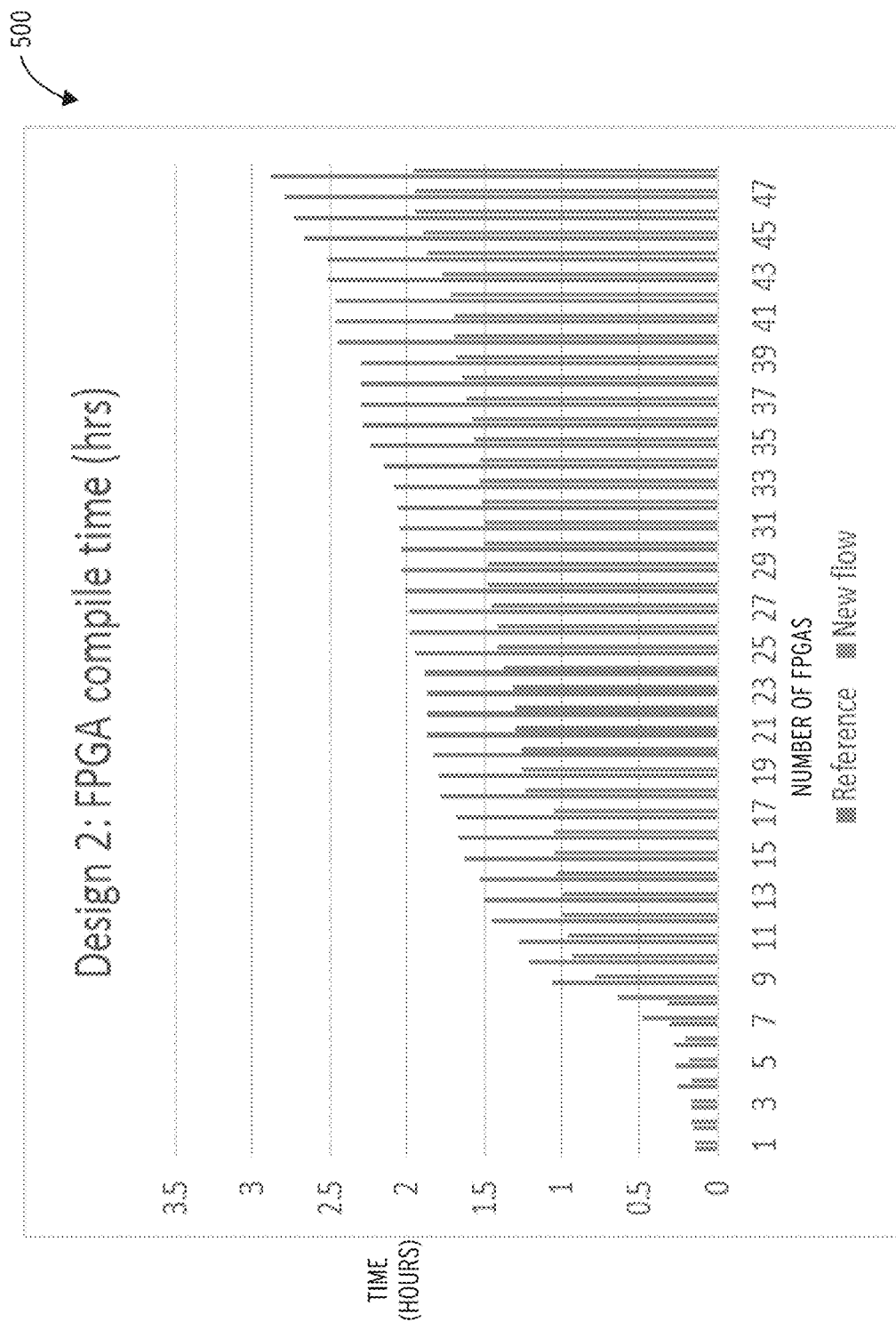
FIG. 5 illustrates exemplary design results 500.

Referring to FIG. 5, exemplary design results 500 are illustrated for FPGA-vendor support on a 50-FPGA design. The design results 500 show compile time for a number of FPGAs for a conventional, reference method of FPGA compilation (blue), vs a method utilizing the disclosed processes with addition of FPGA-vendor support. (red) The design results 500 show a reduction of longest compilation by approximately one hour (2.9 hours vs 2.0 hours). Both of the design results 500 were obtained using the process 200 described above for partitioning the DUT into FPGAs; thus, the benefit shown in the new flow results is cumulative to performance benefits provided by the process 200 described above.

Figure 6:
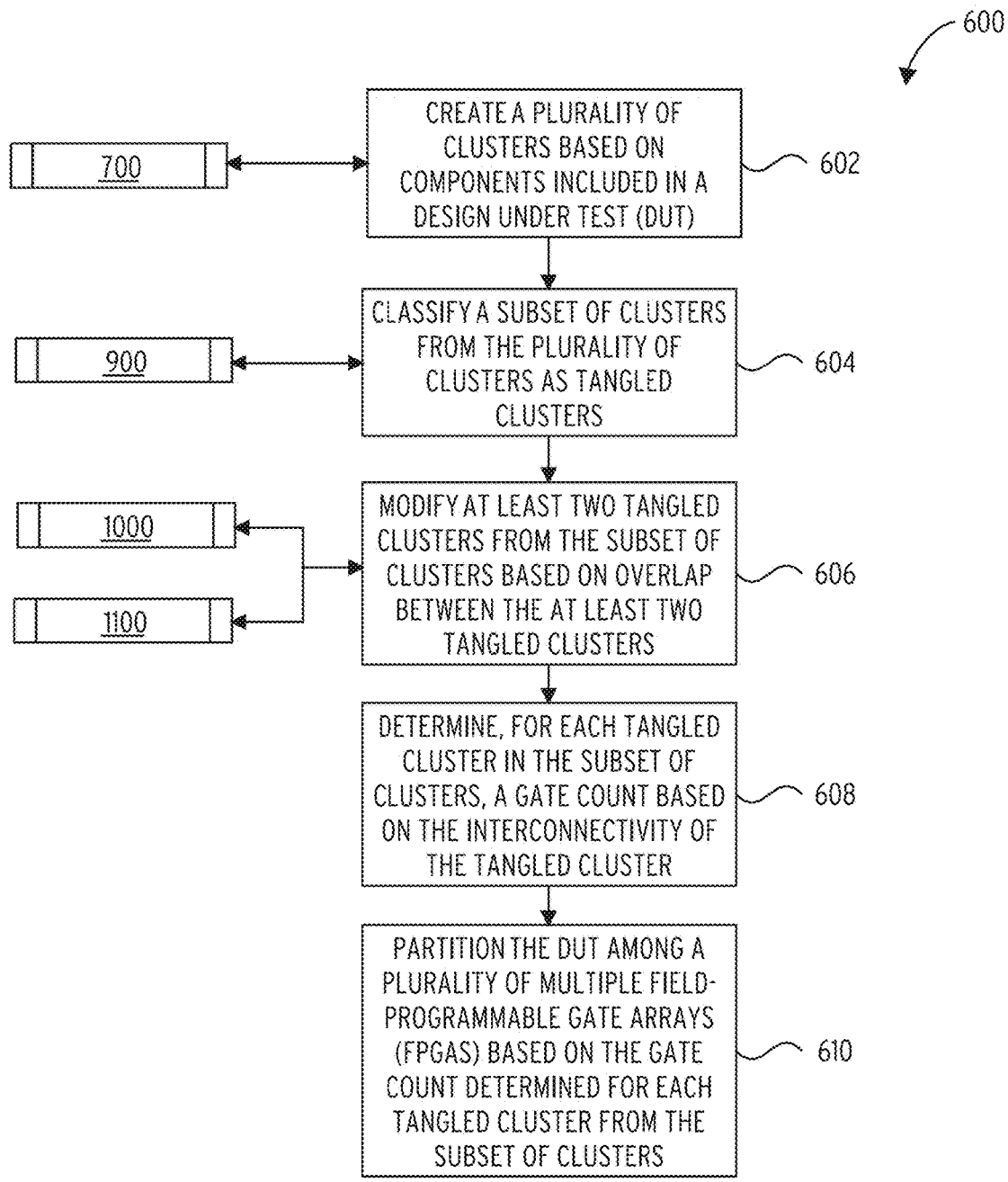
FIG. 6 illustrates an embodiment of an FPGA compilation method 600.

FIG. 6 shows an FPGA compilation process 600 which is performed by the compiler 106. An emulation compiler may perform a portion of the process 600, and an FPGA compiler may perform another portion of the process 600. For example, an emulation compile may perform steps 602-608, resulting in a partitioned DUT, while an FPGA compiler may perform step 610. Any of the techniques described above with respect to FIG. 2 may be incorporated in the FPGA compilation process 600.

Figure 7:
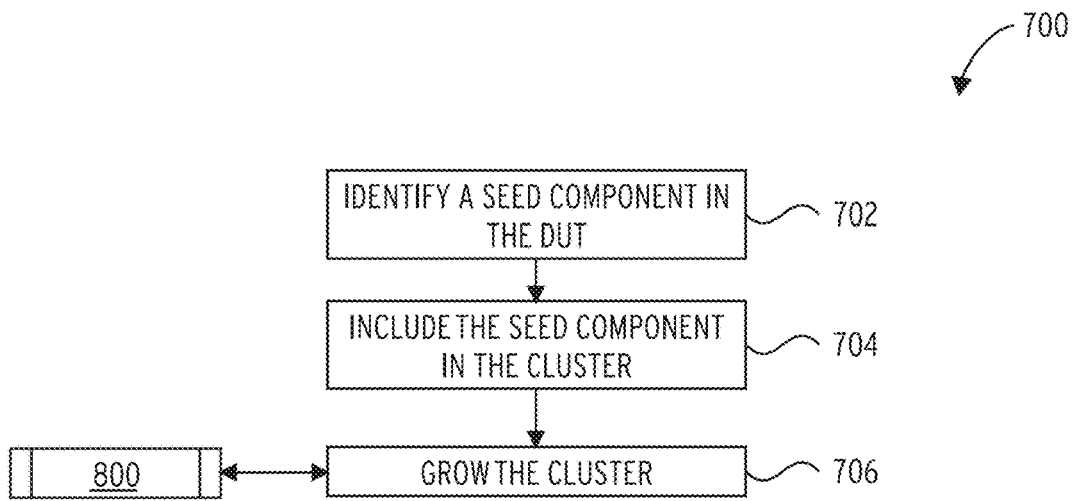
FIG. 7 illustrates an embodiment of a cluster creation subroutine 700.

The compiler 106 creates a plurality of clusters based on components included in a circuit design under test (DUT), e.g., circuit design 104 (block 602). This process may utilize a cluster creation subroutine 700 for example as depicted in FIG. 7.

Figure 9:
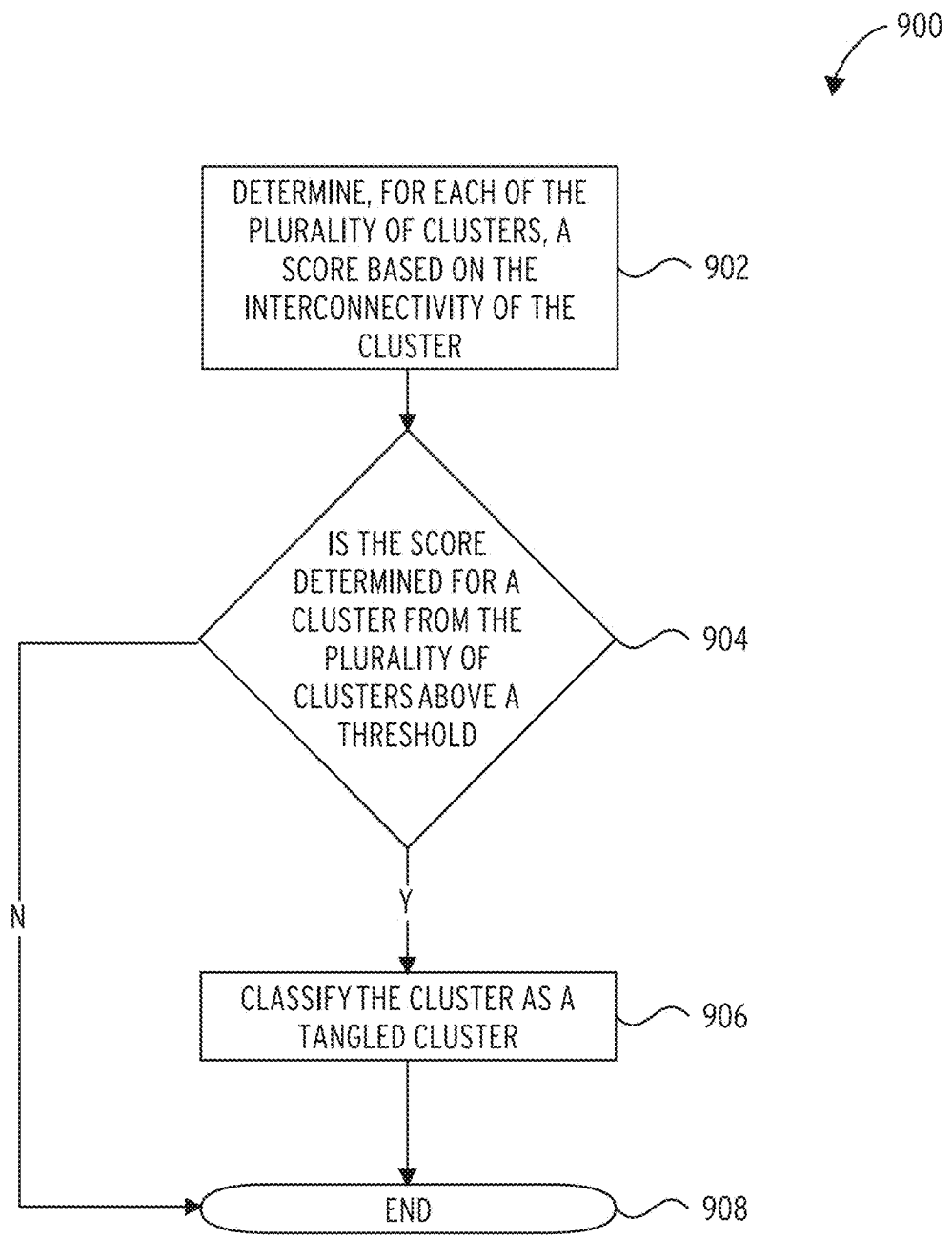
FIG. 9 illustrates an embodiment of a cluster subset classification subroutine 900.
Figure 10:
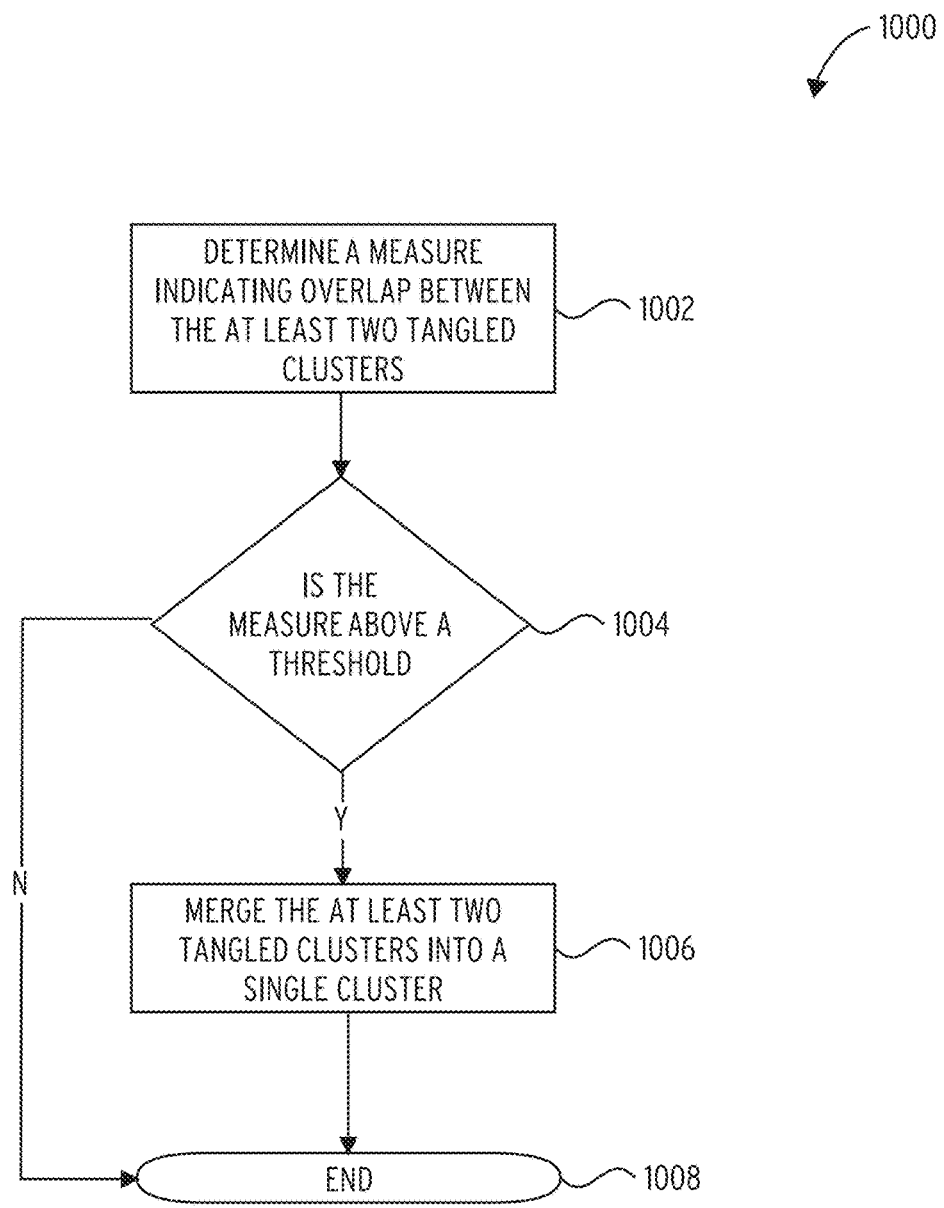
FIG. 10 illustrates an embodiment of a cluster modification subroutine 1000.
Figure 11:
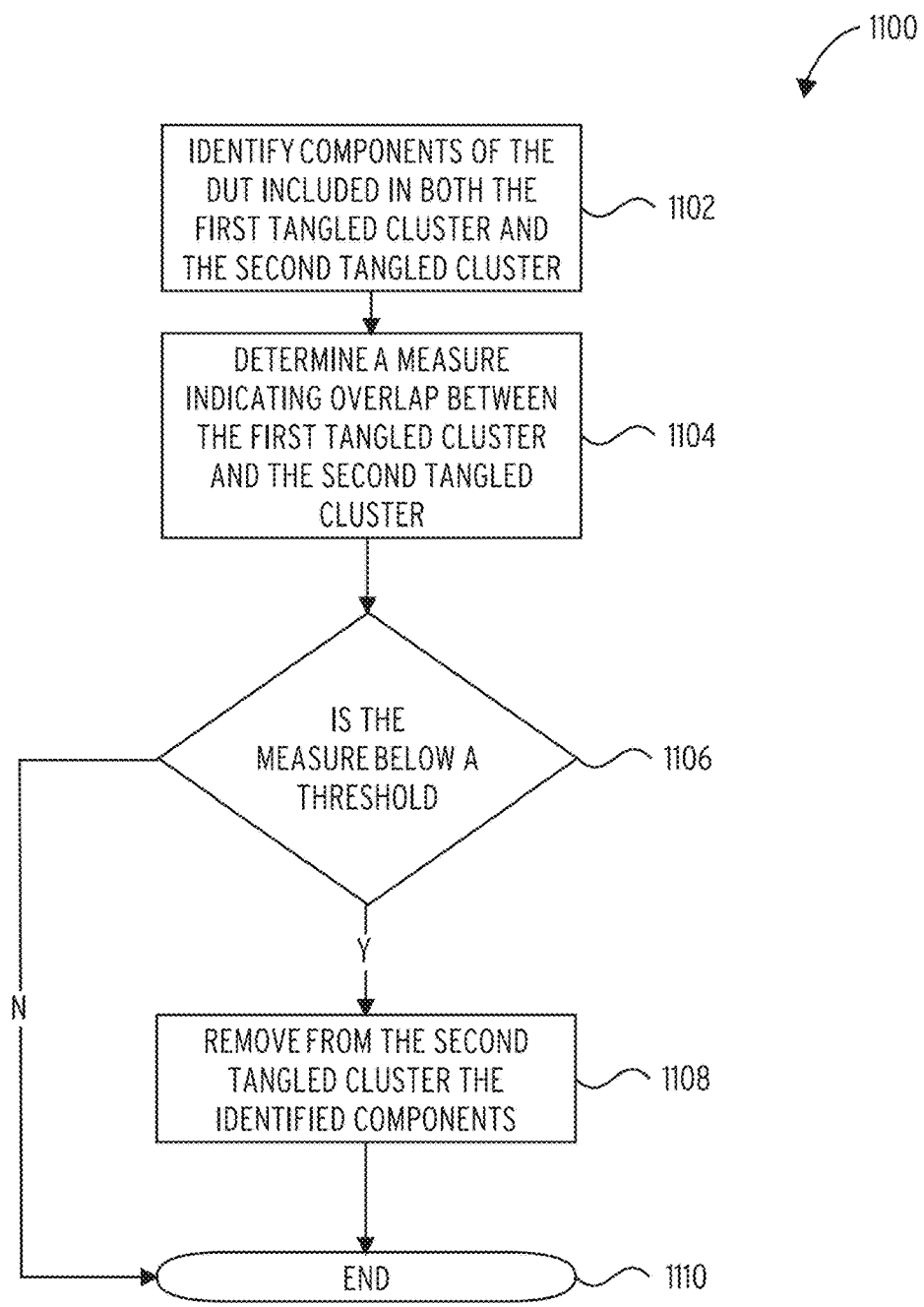
FIG. 11 illustrates an embodiment of an alternate cluster modification subroutine 1100.

The compiler 106 classifies a subset of the clusters of the plurality of clusters as tangled clusters (block 604). This process may utilize a cluster subset classification subroutine 900 for example as depicted in FIG. 9. The compiler 106 then modifies at least two tangled clusters of the subset of clusters based on overlap between the at least two tangled clusters (block 606). This process may utilize a cluster modification subroutine 1000, an alternate cluster modification subroutine 1100, or combination thereof. Exemplary cluster modification subroutines 1000 and 1100 are depicted in FIGS. 10 and 11.

The compiler 106 determines a gate count for each tangled cluster in the subset of clusters based on the interconnectivity of the tangled cluster (block 608). The compiler 106 then partitions the DUT among a plurality of multiple field-programmable gate arrays (FPGAs) based on the gate count determined for each tangled cluster from the subset of clusters (block 610).

In some embodiments, each tangled cluster of the subset of clusters may be mapped to a different FPGA of the plurality of FPGAs. Each component of a tangled cluster of the subset of clusters may be assigned a weighting factor corresponding to being part of a tangled cluster. The compiler 106 may use the weighting factor in mapping the component to an FPGA of the plurality of FPGAs. For each component of a tangled cluster from the subset of clusters, mapping the component to an FPGA of the plurality of FPGAs may involve increasing an area of the component using whitespacing; the area may be increased by a factor that is determined based on parameters of the tangled cluster.

The parameters of the cluster may include one or more of the following: a size of the tangled cluster, interconnectivity of the tangled cluster, and a filling-rate of the FPGA. Finally, the FPGA may include a plurality of sub-components, and responsive to multiple tangled clusters of the subset of clusters being mapped to the FPGA, the compiler 106 may map each of the multiple tangled clusters to a different sub-component of the plurality of sub-components included in the FPGA.

Figure 8:
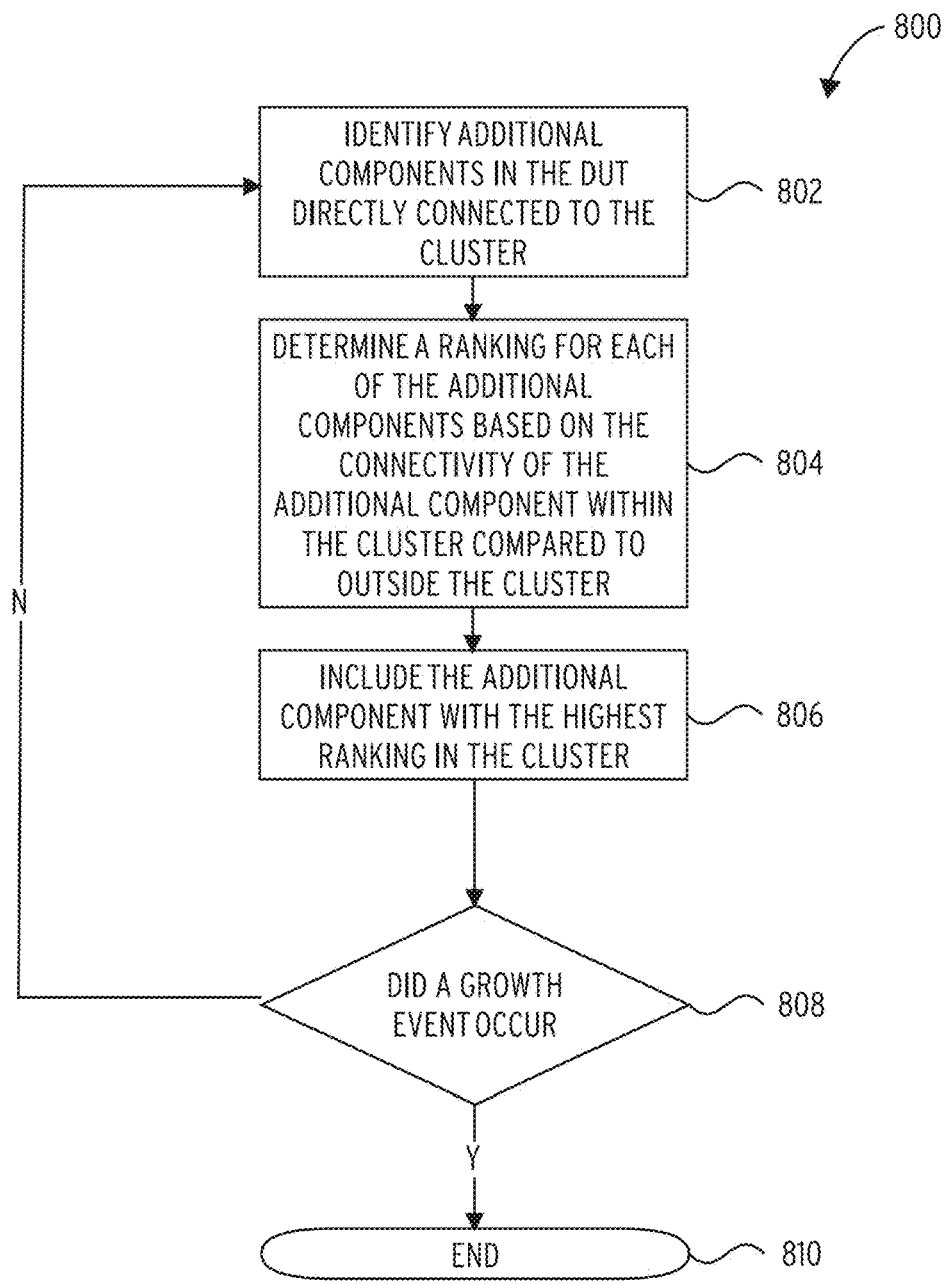
FIG. 8 illustrates an embodiment of a cluster growth subroutine 800.

Referring to FIG. 7, the cluster creation subroutine 700 first involves identifying a seed component in the DUT (block 702). The seed component is then incorporated into the cluster (block 704). Finally, the cluster is grown (block 706). The cluster may be grown in accordance with a cluster growth subroutine 800, which is depicted in FIG. 8. The cluster creation subroutine 700 may involve similar processes to those described above with respect to blocks 202 and 204 of process 200.

Referring to FIG. 8, a cluster growth subroutine 800 first involves identifying additional components in the DUT directly connected to the cluster (block 802). A ranking for each of the additional components is determined based on the connectivity of the additional component within the cluster compared to the connectivity of the additional component outside the cluster (block 804).

The additional component with the highest ranking is included in the cluster (block 806). Whether a growth event occurred is determined (decision block 808). The growth event may comprise at least one of: a maximum size for the cluster being reached; no additional components being directly connected to the cluster; and a score for the cluster going below a stop threshold after being above a tangled threshold, the score determined based on the interconnectivity of the cluster. If a growth event occurred, the cluster growth subroutine 800 ends (done block 810). If not, the cluster growth subroutine 800 returns to the block 802.

Referring to FIG. 9, a cluster subset classification subroutine 900 comprises determining, for each of the plurality of clusters, a score based on the interconnectivity of the cluster (block 902). Whether the score determined for a cluster from the plurality of clusters is above a threshold is determined (decision block 904). If so, the cluster is classified as a tangled cluster (block 906). If not or after the cluster has been classified as a tangled cluster, the cluster subset classification subroutine 900 ends (done block 908). The cluster subset classification subroutine 900 may involve similar processes to those described above with respect to blocks 206-210 of process 200.

Referring to FIG. 10, a cluster modification subroutine 1000 comprises determining a measure indicating overlap between the at least two tangled clusters (block 1002). Whether the measure is above a threshold is determined (decision block 1004). If so, the at least two tangled clusters are merged into a single cluster (block 1006). If the tangled clusters are not to be merged, or once the tangled clusters have been merged, the cluster modification subroutine 1000 ends (done block 1008).

Referring to FIG. 11, an alternate cluster modification subroutine 1100 comprises identifying components of the DUT included in both the first tangled cluster and the second tangled cluster (block 1102). A measure indicating overlap between the first tangled cluster and the second tangled cluster is determined (block 1104). Whether the measure is below a threshold is determined (decision block 1106). If so, the identified components are removed from the second tangled cluster (block 1108). The identified components may be removed from the second tangled cluster based on the second tangled cluster being smaller than the first tangled cluster. If no identified components are removed, or once the identified components are removed, the alternate cluster modification subroutine 1100 ends (done block 1110). One or both of the cluster modification subroutines 1000 and 1100 may involve aspects of the process described above with respect to block 216 of process 200.

In some embodiments, the cluster modification subroutines 1000 and 1100 are incorporated into a single subroutine which involves identifying common components between two tangled clusters, determining a measure of overlap between the two tangled clusters, and determining whether the measure of overlap is above or below a threshold. If the measure of overlap is above the threshold, the compiler 106 merges the two tangled clusters into a single cluster; if the measure of overlap is below the threshold, the compiler 106 removes the overlapping components from one of the two clusters, e.g., from the smaller cluster, as described above with respect to block 216.

Figure 12:
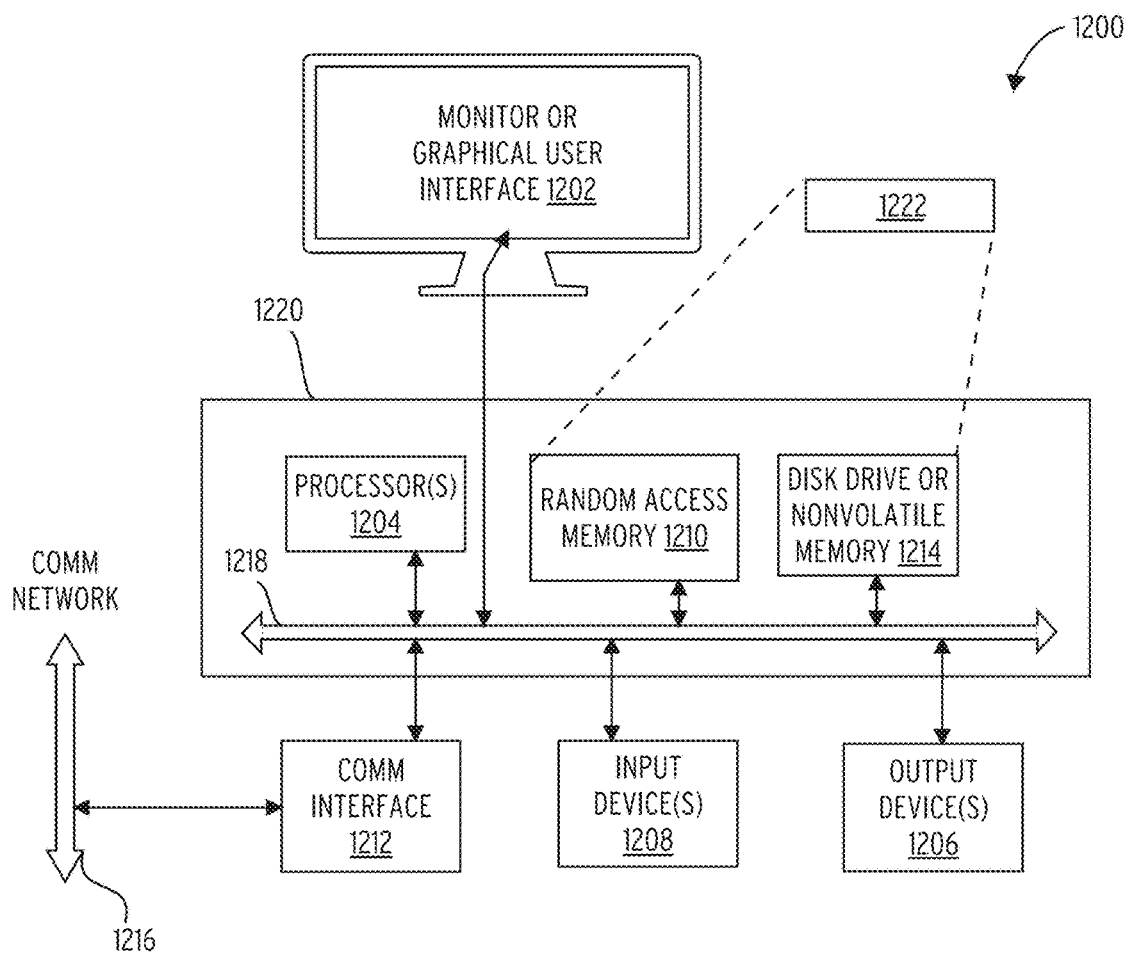
FIG. 12 is an example block diagram of a computer system 1200 that may incorporate embodiments as disclosed herein.

FIG. 12 is an example block diagram of a computer system 1200 that may incorporate embodiments of the present invention. FIG. 12 is merely illustrative of a machine system to carry out aspects of the technical processes described herein, and does not limit the scope of the claims. One of ordinary skill in the art would recognize other variations, modifications, and alternatives. In one embodiment, the computer system 1200 typically includes a monitor or graphical user interface 1202, a computer 1220, a communication network interface 1212, input device(s) 1208, output device(s) 1206, and the like.

As depicted in FIG. 12, the computer 1220 may include one or more processor(s) 1204 that communicate with a number of peripheral devices via a bus subsystem 1218. These peripheral devices may include input device(s) 1208, output device(s) 1206, communication network interface 1212, and a storage subsystem, such as a random access memory 1210 and a disk drive or nonvolatile memory 1214.

The random access memory 1210 and/or the disk drive or nonvolatile memory 1214 may store computer-executable instructions and thus forming logic 1222 that when applied to and executed by the processor(s) 1204 implement embodiments of the processes disclosed herein.

The input device(s) 1208 include devices and mechanisms for inputting information to the computer 1220. These may include a keyboard, a keypad, a touch screen incorporated into the monitor or graphical user interface 1202, audio input devices such as voice recognition systems, microphones, and other types of input devices. In various embodiments, the input device(s) 1208 are typically embodied as a computer mouse, a trackball, a track pad, a joystick, wireless remote, drawing tablet, voice command system, eye tracking system, and the like. The input device(s) 1208 typically allow a user to select objects, icons, text and the like that appear on the monitor or graphical user interface 1202 via a command such as a click of a button or the like.

The output device(s) 1206 include all possible types of devices and mechanisms for outputting information from the computer 1220. These may include a display (e.g., monitor or graphical user interface 1202), non-visual displays such as audio output devices, etc.

The communication network interface 1212 provides an interface to communication networks (e.g., communication network 1216) and devices external to the computer 1220. The communication network interface 1212 may serve as an interface for receiving data from and transmitting data to other systems. Embodiments of the communication network interface 1212 typically include an Ethernet card, a modem (telephone, satellite, cable, ISDN), (asynchronous) digital subscriber line (DSL) unit, FireWire interface, USB interface, and the like. For example, the communication network interface 1212 may be coupled to the communication network 1216 via a FireWire bus, or the like. In other embodiments, the communication network interface 1212 may be physically integrated on the motherboard of the computer 1220, and may be a software program, such as soft DSL, or the like.

In various embodiments, the computer system 1200 may also include software that enables communications over a network such as the HTTP, TCP/IP, RTP/RTSP protocols, and the like. In alternative embodiments, other communications software and transfer protocols may also be used, for example IPX, UDP or the like. In some embodiments, the processor(s) 1204 may include one or more microprocessors from Intel®. Further, one embodiment, the computer 1220 includes a UNIX-based operating system.

The random access memory 1210 and the disk drive or nonvolatile memory 1214 are examples of tangible media configured to store data and instructions to implement various embodiments of the processes described herein, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The random access memory 1210 and the disk drive or nonvolatile memory 1214 may be configured to store the basic programming and data constructs that provide the functionality of the disclosed processes and other embodiments thereof that fall within the scope of the present invention.

Software code modules and instructions that implement embodiments of the present invention may be stored in the random access memory 1210 and/or the disk drive or nonvolatile memory 1214. These software modules may be executed by the processor(s) 1204. The random access memory 1210 and the disk drive or nonvolatile memory 1214 may also provide a repository for storing data used by the software modules.

The random access memory 1210 and the disk drive or nonvolatile memory 1214 may include a number of memories including a main random access memory (RAM) for storage of instructions and data during program execution and a read only memory (ROM) in which fixed non-transitory instructions are stored. The random access memory 1210 and the disk drive or nonvolatile memory 1214 may include a file storage subsystem providing persistent (non-volatile) storage for program and data files. The random access memory 1210 and the disk drive or nonvolatile memory 1214 may include removable storage systems, such as removable flash memory.

The bus subsystem 1218 provides a mechanism for letting the various components and subsystems of computer 1220 communicate with each other as intended. Although the communication network interface 1212 is depicted schematically as a single bus, alternative embodiments of the bus subsystem 1218 may utilize multiple busses.

It will be readily apparent to one of ordinary skill in the art that many other hardware and software configurations are suitable for use with embodiments of the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Those having skill in the art will appreciate that there are various logic implementations by which processes and/or systems described herein can be effected (e.g., hardware, software, or firmware), and that the preferred vehicle will vary with the context in which the processes are deployed. If an implementer determines that speed and accuracy are paramount, the implementer may opt for a hardware or firmware implementation; alternatively, if flexibility is paramount, the implementer may opt for a solely software implementation; or, yet again alternatively, the implementer may opt for some combination of hardware, software, or firmware. Hence, there are numerous possible implementations by which the processes described herein may be effected, none of which is inherently superior to the other in that any vehicle to be utilized is a choice dependent upon the context in which the implementation will be deployed and the specific concerns (e.g., speed, flexibility, or predictability) of the implementer, any of which may vary. Those skilled in the art will recognize that optical aspects of implementations may involve optically-oriented hardware, software, and or firmware.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more computing devices. The particular distribution and choice of logic will vary according to implementation.

The foregoing detailed description has set forth various embodiments of the devices or processes via the use of block diagrams, flowcharts, or examples. Insofar as such block diagrams, flowcharts, or examples contain one or more functions or operations, it will be understood as notorious by those within the art that each function or operation within such block diagrams, flowcharts, or examples can be implemented, individually or collectively, by a wide range of hardware, software, firmware, or virtually any combination thereof. Portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more processing devices (e.g., as one or more programs running on one or more computer systems), as one or more programs running on one or more processors (e.g., as one or more programs running on one or more microprocessors), as firmware, or as virtually any combination thereof, and that designing the circuitry or writing the code for the software or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, flash drives, SD cards, solid state fixed or removable storage, and computer memory.

In a general sense, those skilled in the art will recognize that the various aspects described herein which can be implemented, individually or collectively, by a wide range of hardware, software, firmware, or any combination thereof can be viewed as being composed of various types of circuitry.

Those skilled in the art will recognize that it is common within the art to describe devices or processes in the fashion set forth herein, and thereafter use standard engineering practices to integrate such described devices or processes into larger systems. At least a portion of the devices or processes described herein can be integrated into a network processing system via a reasonable amount of experimentation. Various embodiments are described herein and presented by way of example and not limitation.

What is claimed is:

1. A computer-implemented method comprising:
   generating a plurality of clusters, each cluster of the plurality of clusters comprising one or more components in a circuit design, the one or more components comprising one or more gates;
   classifying a subset of clusters of the plurality of clusters as tangled clusters, wherein each of the tangled clusters is highly connected;
   modifying at least two tangled clusters from the subset of clusters based on overlap between the at least two tangled clusters;
   determining, for each tangled cluster in the subset of clusters, a gate count based on an interconnectivity of the tangled cluster; and
   partitioning the circuit design among one or more field-programmable gate arrays (FPGAs) based on the gate count determined for each tangled cluster from the subset of clusters.

2. The method of claim 1, wherein generating a cluster of the plurality of clusters comprises:
   identifying a seed component of the cluster from the one or more components in the circuit design;
   growing the cluster to a predetermined size by including additional components in the cluster; and
   determining a score based on the components in the cluster.

3. The method of claim 2, wherein the growing the cluster to a predetermined size comprises:
 (a) identifying additional components of the one or more components in the circuit design directly connected to the cluster;
 (b) determining, for each of the identified additional components, a ranking based on a comparison of a first connectivity of the identified additional component within the cluster to a second connectivity of the identified additional component outside the cluster;
 (c) including a highest ranked component of the identified additional components in the cluster; and
 repeating steps (a), (b), and (c) until a growth event occurs.

4. The method of claim 3, wherein the growth event comprises at least one of: a maximum size for the cluster being reached, no additional components of the one or more components in the circuit design being directly connected to the cluster, and the determined score for the cluster going below a stop threshold after being above a tangled threshold, the score determined based on the interconnectivity of the cluster.

5. The method of claim 1, wherein classifying each cluster of the subset of clusters as a tangled cluster comprises:
 determining a score based on the interconnectivity of the cluster; and
 responsive to the score determined for the cluster being above a threshold, classifying the cluster as a tangled cluster.

6. The method of claim 1, wherein modifying at least two tangled clusters comprises:
 determining a measure indicating overlap between the at least two tangled clusters; and
 responsive to the measure being above a threshold, merging the at least two tangled clusters into a single cluster.

7. The method of claim 1, wherein the at least two tangled clusters comprise a first tangled cluster and a second tangled cluster and modifying the at least two tangled clusters comprises:
 identifying components of the circuit design included in both the first tangled cluster and the second tangled cluster;
 determining a measure indicating overlap between the first tangled cluster and the second tangled cluster; and
 responsive to the measure being below a threshold, removing from the second tangled cluster the identified components.

8. The method of claim 7, wherein the identified components are removed from the second tangled cluster based on the second tangled cluster being smaller than the first tangled cluster.

9. The method of claim 1, wherein each tangled cluster from the subset of clusters is mapped to a different FPGA of the one or more FPGAs.

10. The method of claim 1, wherein each component of a tangled cluster from the subset of clusters is assigned a weighting factor corresponding to being part of a tangled cluster, wherein the weighting factor is used in mapping the component to an FPGA of the one or more FPGAs.

11. The method of claim 1, wherein for each component of a tangled cluster from the subset of clusters, mapping the component to an FPGA of the one or more FPGAs comprises:
 increasing an area of the component using whitespacing, the area increased by a factor determined based on parameters of the tangled cluster.

12. The method of claim 11, wherein the parameters of the cluster include one or more of the following: a size of the tangled cluster, interconnectivity of the tangled cluster, and filling rate of the FPGA.

13. The method of claim 11, wherein the FPGA is comprised of a plurality of sub-components, and responsive to multiple tangled clusters from the subset of clusters being mapped to the FPGA, mapping each of the multiple tangled clusters to a different sub-component from the plurality of sub-components.

14. A non-transitory computer readable storage medium storing instructions, the instructions when executed by one or more processors cause the one or more processors to perform operation comprising:
 generating a plurality of clusters, each cluster of the plurality of clusters comprising one or more components in a circuit design, the one or more components comprising one or more gates;
 classifying a subset of clusters of the plurality of clusters as tangled clusters, wherein each of the tangled clusters is highly connected;
 modifying at least two tangled clusters from the subset of clusters based on overlap between the at least two tangled clusters;
 determining, for each tangled cluster in the subset of clusters, a gate count based on an interconnectivity of the tangled cluster; and
 partitioning the circuit design among one or more field-programmable gate arrays (FPGAs) based on the gate count determined for each tangled cluster from the subset of clusters.

15. The computer readable storage medium of claim 14, wherein generating a cluster of the plurality of clusters comprises:
 identifying a seed component of the cluster from the one or more components in the circuit design;
 growing the cluster to a predetermined size by including additional components in the cluster; and
 determining a score based on the components in the cluster.

16. The computer readable storage medium of claim 15, wherein the growing the cluster to a predetermined size comprises:
 (a) identifying additional components of the one or more components in the circuit design directly connected to the cluster;
 (b) determining, for each of the identified additional components, a ranking based on a comparison of a first connectivity of the identified additional component within the cluster to a second connectivity of the identified additional component outside the cluster;
 (c) including a highest ranked component of the identified additional components in the cluster; and
 repeating steps (a), (b), and (c) until a growth event occurs.

17. The computer readable storage medium of claim 16, wherein the growth event comprises at least one of: a maximum size for the cluster being reached, no additional components of the one or more components in the circuit design being directly connected to the cluster, and the determined score for the cluster going below a stop threshold after being above a tangled threshold, the score determined based on the interconnectivity of the cluster.

18. The computer readable storage medium of claim 14, wherein classifying each cluster of the subset of clusters as a tangled cluster comprises:

determining a score based on the interconnectivity of the cluster;

responsive to the score determined for the cluster being above a threshold, classifying the cluster as a tangled cluster.

19. The computer readable storage medium of claim 14, wherein modifying at least two tangled clusters comprises:

determining a measure indicating overlap between the at least two tangled clusters; and responsive to the measure being above a threshold, merging the at least two tangled clusters into a single cluster.

20. The computer readable storage medium of claim 14, wherein the at least two tangled clusters comprise a first tangled cluster and a second tangled cluster and modifying the at least two tangled clusters comprises:

identifying components of the circuit design included in both the first tangled cluster and the second tangled cluster;

determining a measure indicating overlap between the first tangled cluster and the second tangled cluster; and responsive to the measure being below a threshold, removing from the second tangled cluster the identified components.

21. The computer-implemented method of claim 1, wherein the circuit design is used in emulation.

22. The computer readable storage medium of claim 14, wherein the circuit design is used in emulation.

* * * * *